(12) United States Patent
Choi et al.

(10) Patent No.: US 6,279,503 B1
(45) Date of Patent: Aug. 28, 2001

(54) CHEMICAL VAPOR DEPOSITION APPARATUS FOR MANUFACTURING SEMICONDUCTOR DEVICES

(75) Inventors: Baik-soon Choi, Seoul; Jung-il An; Jin-sung Kim, both of Suwon; Jung-ki Kim, Seoul, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/183,599

(22) Filed: Oct. 29, 1998

(30) Foreign Application Priority Data

Oct. 29, 1997 (KR) .................................................. 97-56009

(51) Int. Cl.[7] .............................. C23C 16/00; G01N 7/00
(52) U.S. Cl. ............................ 118/715; 422/83; 73/863; 73/864; 118/724
(58) Field of Search ........................... 118/715, 724; 156/345; 422/83, 103, 904; 73/863, 864

(56) References Cited

U.S. PATENT DOCUMENTS

| | | | |
|---|---|---|---|
| 5,484,484 | * | 1/1996 | Yamaga et al. ...................... 118/719 |
| 5,521,381 | * | 5/1996 | Gregg et al. .......................... 250/288 |
| 5,793,913 | * | 8/1998 | Kovacic ................................. 385/49 |
| 5,834,371 | * | 11/1998 | Ameen et al. ........................ 438/656 |
| 5,932,797 | * | 8/1999 | Myneni ................................. 73/40.7 |
| 5,938,850 | * | 8/1999 | Arami et al. ......................... 118/715 |

* cited by examiner

Primary Examiner—Jeffrie R. Lund
Assistant Examiner—Sylvia R. MacArthur
(74) Attorney, Agent, or Firm—Marger Johnson & McCollom, P.C.

(57) ABSTRACT

There is provided a method of optimizing recipe of in-situ cleaning process for process chamber after a specific process on semiconductor wafers by using Residual Gas Analyzer Quadrupole Mass Spectrometer (RGA-QMS). According to the present invention, a Chemical Vapor Deposition (CVD) apparatus for manufacturing semiconductor devices comprises: a process chamber; process gas supply line for supplying process gas into the process chamber; a waste-gas exhaust line for removing the waste-gas from the process chamber after process; a supply line for supplying a $CiF_3$ gas into the process chamber; a sampling manifold for sampling the gas inside process chamber by using pressure difference; and RGA-QMS for analyzing the sampling gas, and the optimization of the end points according to gas flow, pressure, and temperature of the cleaning process for the process chamber is achieved through the analysis by above RGA-QMS.

10 Claims, 5 Drawing Sheets

CHEMICAL VAPOR DEPOSITION APPARATUS FOR MANUFACTURING SEMICONDUCTOR DEVICES

FIELD OF THE INVENTION

The present invention relates to a Chemical Vapor Deposition apparatus for manufacturing semiconductor devices, its driving method, and a method of optimizing a cleaning process for the process chamber. More particularly, the invention relates to in-situ cleaning of process chamber after processing of semiconductor wafers by using Residual Gas Analyzer Quadrupole Mass Spectrometer (RGA-QMA).

DESCRIPTION OF THE RELATED ART

Generally, the semiconductor device fabrication process is carried out inside a process chamber having certain pre-set process conditions. In particular, when a CVD (Chemical Vapor Deposition) process is performed on a semiconductor wafer, a layer of material is deposited not only on the wafer, but also on the inner wall of the process chamber tube, and the boat(s) for moving the wafers between the process chamber and a loadlock chamber where the wafers are stored. As these unwanted layers are repeatedly stressed during the loading/unloading of the wafers, particles are released into the chamber that can cause defects on the wafer during the fabrication process.

In order to reduce the causes for defects, PM (Preventive Maintenance) is repeatedly conducted to clean the process tube at regular intervals, but the productivity of semiconductor devices is decreased due to the interruption of the process line operation.

FIG. 1 illustrates a conventional PM sequence for a general process tube. First, the system is cooled down after carrying out a specific process on semiconductor wafers. After the process chamber is completely cooled, the tubes of the process chamber are taken out one by one so as to carry out wet-etch cleaning of the tubes. The wet-etch generally uses chemicals such as HF group in order to remove a polysilicon film or a silicon nitride film from the inside of the process tube. Then, the removed tubes are assembled inside the process chamber and a vacuum test is performed. Process Recertification is carried out to see if the process chamber is ready for a new process and if the process conditions for the next process are substantially set up therein.

However, the above PM process represents considerable efforts and expenses, and takes over 24 hours to complete. Therefore, in order to overcome the problems, a plasma etch of using $NF_3$ and $CF_4$ gas is carried out instead of the wet-etch. Alternatively, Thermal Shock Technology is used for removing the layers formed by thermal stress inside the chamber, or the chamber is dry-etch using $ClF_3$, $BrF_5$.

However, even though these technologies are employed, the tubes still must be removed and reassembled and the expense, the labor, and downtime remain as problems.

SUMMARY OF THE INVENTION

The present invention is directed to provide a CVD apparatus for manufacturing semiconductor devices wherein a process chamber is equipped with cleaning gas supply line, a sampling manifold, and a gas analyzer which are used to clean the tubes in situ. As a result, the method of the present invention substantially obviates one or more problems, disadvantages, and limitations of prior art.

Another object of the present invention is to provide a method of driving the CVD apparatus, wherein a specific process is performed on wafers, and then in-situ cleaning is performed inside a process chamber, after semiconductor wafers are unloaded.

Another object of the present invention is to provide a method of optimizing a cleaning process for a process chamber.

To achieve these and other advantages and in accordance with the purpose of the present invention as embodied and broadly described, a CVD apparatus of the present invention includes a process chamber in which a deposition process for manufacturing semiconductor devices is carried out; a plurality of process gas supply lines for supplying process gases to the process chamber; a waste-gas exhaust line for removing the waste-gas from the process chamber; a cleaning-gas supply line for supplying a cleaning gas to the process chamber; a sampling manifold connected to the process chamber for sampling the gas inside therein by using pressure difference; and a gas analyzer for analyzing the sampling gas from the sampling manifold.

Preferably, the process chamber is a Low Pressure Chemical Vapor Deposition (LPCVD) chamber having a sealed outer tube and an inner tube having an open top inside the outer tube. The cleaning gas is $ClF_3$. The cleaning-gas supply line is connected to the inner tube, and the sampling manifold is connected to the outer tube. An orifice is installed in the sampling manifold such that the pressure therein is maintained at the same pressure as in the process chamber. The sampling manifold comprises a first air valve, a second air valve, a first isolation valve, a second isolation valve, a third isolation valve, and a gate valve between the connecting point with the outer tube. A purge-gas supply line is also provided in the sampling manifold. The purge-gas supply line of the sampling manifold is connected to the first air valve and the second air valve respectively from the purge gas supply source, and third and a forth air valves are further provided between them respectively. A Capacitance Manometer (CM) gauge and a sampling pump are preferably installed between the first isolation valve and the second isolation valve of the sampling manifold in order to control the first pressure of the sampling manifold.

A scrubber is provided for receiving and cleaning the waste-gas passing through the waste-gas exhaust line, and the gas sampling line.

The gas analyzer is preferably a RGA-QMS(Residual Gas Analyzer-Quadrupole Mass Spectrometer) comprising a mass-analyzer, a turbo pump, and a baking pump, which is preferable in the aspect of environmental protection.

The invention is also embodied in a method of driving a CVD apparatus for manufacturing semiconductor devices. The CVD apparatus includes: a process chamber; a plurality of process gas supply lines for supplying process gases into the process chamber; a waste-gas exhaust line for removing the waste-gas from the process chamber after processing; a cleaning-gas supply line for supplying a cleaning gas to the process chamber; a sampling manifold connected to the process chamber; and a gas analyzer for analyzing the sampling gas from the sampling manifold. The method comprises the steps a) sampling the gas from the process chamber; b) outgasing while baking the gas in order to reduce the initial background of the gas analyzer below a certain value; c) conducting a contamination analysis of each of the process gas supply lines; d) performing a specific process for the semiconductor wafers contained in the process chamber) unloading the wafers after the above specific process is completed, and exhausting the waste-gas from the process chamber; and f) cleaning the inside of the process chamber by supplying a cleaning gas thereinto.

The sampling manifold and the gas analyzer are continuously purged with a purge gas before conducting the sampling to ensure the precision of the gas analyzer. The contamination analysis for the process gas supply line is performed by passing nitrogen gas through each isolated process gas supply line and checking for leakage. Preferably, the fabrication process of semiconductor wafers is the one for forming a silicon-containing layer on the wafer, and the cleaning process is conducted by introducing nitrogen gas and $ClF_3$ gas as cleaning gases while maintaining uniform pressure and inside the process chamber so that the end point of the cleaning process is easily detected.

The method further comprises a step of measuring particles inside the process chamber before and after the cleaning process, and the step of measuring metal/ion contaminants inside the process chamber before and after the cleaning process so as to determine the effectiveness of the cleaning process.

To achieve still another object of the present invention, a method of optimizing the cleaning process for a process chamber, the cleaning process carried out in-situ after a specific process is performed for a wafer placed inside the process chamber, with a cleaning gas supply line for supplying the cleaning gas into the process chamber, a sampling manifold connected to the process chamber, and a gas analyzer for analyzing the sampling gas from the sampling manifold. The method comprises: a) after performing a specific process on the semiconductor wafer, cleaning the process chamber by supplying a certain amount of nitrogen gas and $ClF_3$ as cleaning gas while maintaining a constant pressure and temperature inside the process chamber until the cleaning end point by the gas analyzer; and b) after performing the same specific process for another semiconductor wafer, cleaning the process chamber by supplying a certain amount of nitrogen gas and $ClF_3$ as cleaning gas, and varying the pressure and the temperature inside the processing chamber until the cleaning end point by the gas analyzer.

Preferably, the end point of the gas analyzer is determined by the intersecting point of amplified traces for an etch gas and the etching byproducts.

According to the present invention, when a specific process is performed on a semiconductor wafer and the cleaning process is carried out inside the process chamber by using $ClF_3$ gas, the mechanism is exactly monitored, and the composition of the cleaning process is optimized to simplify the process and to improve process efficiency.

It is to be understood that both the foregoing general description and the following detailed description are exemplary and explanatory and are intended to provide further explanation of the invention as claimed.

DETAILED DESCRIPTION OF THE PREFERRED EMBODIMENTS

Reference will now be made in detail to the preferred embodiments of the present invention, examples of which are illustrated in the accompanying drawings.

Figure 2:
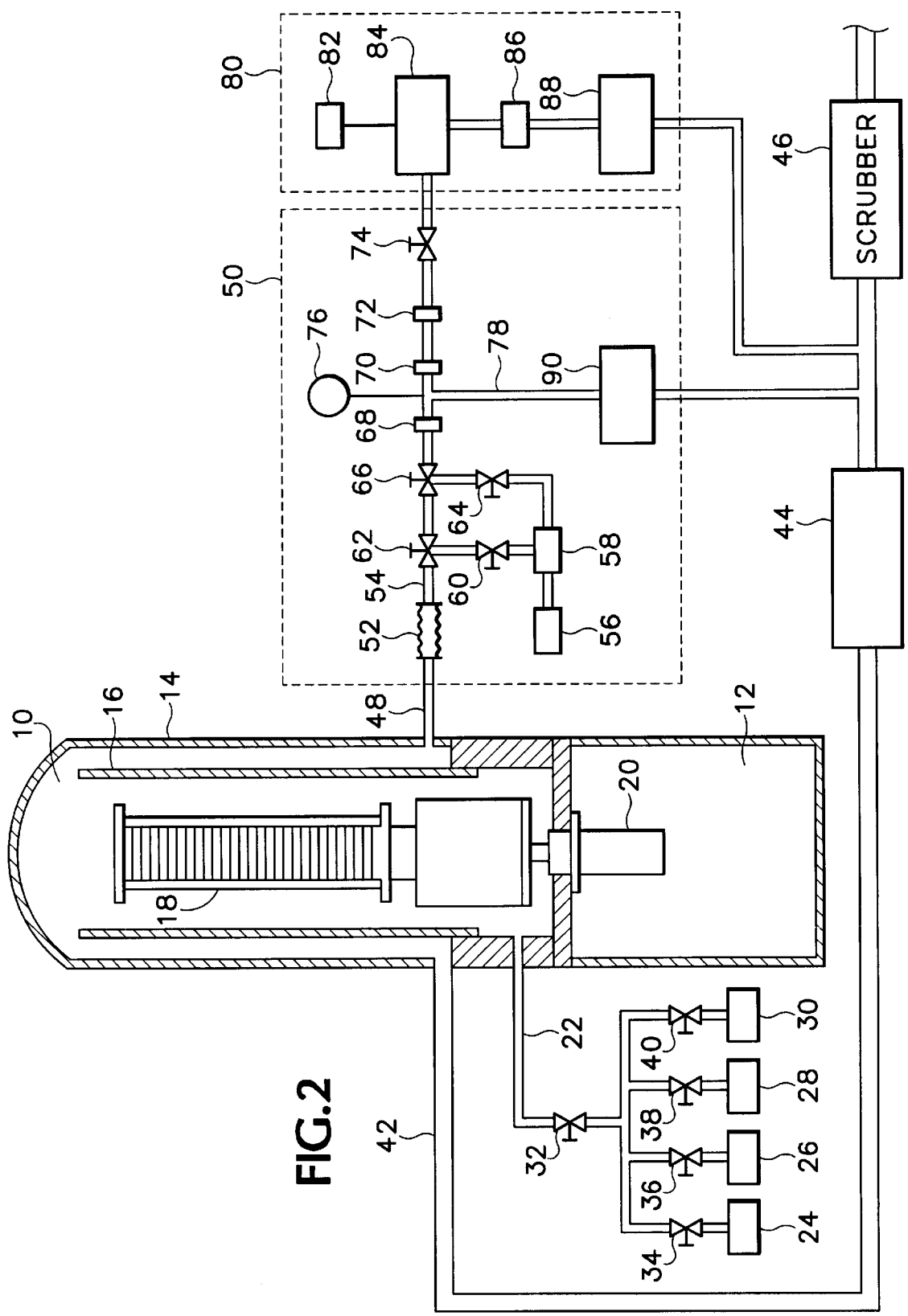
FIG. 2 is a schematic representation showing the CVD apparatus for manufacturing semiconductor devices according to one embodiment of the present invention.

FIG. 2 is a schematic representation showing the CVD apparatus for manufacturing semiconductor devices according to one embodiment of the present invention. A process chamber 10 comprises an outer tube 14 and an inner tube 16. Inside the process chamber 10, various processes such as deposition process, plasma process, diffusion process, or CVD process, etc. are performed. A loadlock chamber 12 is installed below the process chamber. A boat 18 for holding wafers to be processed is moved up and down between the process chamber 10 and the loadlock chamber 12 by an elevator 20. A gas supply line 22 for supplying process gas for processing is connected to the lower side of the inner tube 16. The gas supply line 22 may have a separate pipe line and valve for each process gas or cleaning gas. In the system shown in FIG. 2, individual process gas supply lines and valves 32,34,36,38,40 are provided for $SiH_4$ supply source 24, $PH_3$ supply source 26, $N_2$ supply source 28, and $ClF_3$ supply source 30 respectively. The $ClF_3$ supply source 30 is a cleaning gas supply source, which will be mentioned below. The gas supply line 22 may have a separate pipe line for each process gas or cleaning gas.

Meanwhile, the process waste-gas is evacuated from outer tube 14, through a discharge line 42, by a discharge pump 44, and is then routed to scrubber 46 for cleaning.

In order to monitor the gas composition inside the process chamber 10, a sampling port 48 is installed in the outer tube 14, The sampling port 48 is connected to a sampling manifold 50, preferably by using a flexible connecting line 52. Sampling line 54 of sampling manifold 50 is made of ⅓ inch diameter electropolished stainless steel pipe. Flow through sampling line 54 is controlled by a first air valve 62, a second air valve 66, a first isolation valve 68, a second isolation valve 70, a third isolation valve 72, and a gate valve 74. The first isolation valve 68 and the second isolation valve 70 are each fitted with a 100 micron orifice; and the third isolation valve 72 is fitted with a 250 micron orifice.

The sampling manifold 50 has an $N_2$ supply source 56 for use as a purge gas, which is available whether or not samples are being drawn. The vacuum system can be damaged by the concentration of the gas due to a small amount of water inside the Gas Distribution System (GDS) so that it is very important to precisely control the purge cycle or cleaning time for the process chamber. The $N_2$ 58 is connected to the first air valve 62 and to the second air valve 66. Further, a CM gauge 76 is installed between the first isolation valve 68 and the second isolation valve 70 on sampling line 54. Sample line line 54 is connected to sampling pump 90, which discharges to the scrubber 46.

Meanwhile, sampling line 54 is connected to a gas analyzer 80 through gate valve 74. The gas analyzer 80 uses a commercially available RGA-QMS (Residual Gas Analyzer-Quadrupole Mass Spectrometer 84. An ion gauge 82 is installed on the mass analyzer 84. Sample gases pass through a turbo pump 86 and a baking pump 88, and to the scrubber 46

Meanwhile, the $ClF_3$ gas for use in the present invention is a cleaning gas that can be also used in the cleaning of polysilicon, silicon nitride, silicon glass, and tungsten silicide. It can be used in the low temperature state as well as plasma state, and has the excellent chemical selectivity so that it performs etching at the portions where plasma cannot reach. It also has the advantage that it is highly unlikely to generate particles that could contaminate the wafer surface. In use $ClF_3$ is generally diluted to a concentration of 20+5 volume % with an inert gas such as $N_2$. While the lower pressure in the process chamber is good for the uniform etch for the layer inside the chamber, the higher mixing rate of etch gas is good for increasing the etch rate. It is preferable to heat the process chamber to a temperature higher than the boiling point of the $ClF_3$, prior to the introduction of $ClF_3$ and preferably higher than 400° C. for the desirable etch rate. Since $ClF_3$ is a very reactive gas, if the etch rate is too high, tubes 14 and 16 could also be etched, shortening the useful life of the tube.

The $ClF_3$ supply pipe is preferably formed of nickel, monel, hastelloy, 316L stainless steel, or a polymeric material due to the properties of the $ClF_3$.

Meanwhile, the RGA-QMS (Residual Gas Analyzer-Quadrupole Mass Spectrometer) used as the gas analyzer 80 is operated in such a manner that sampled gas from the process chamber is ionized by bombardment with electrons accelerated with 70 eV. Then, Quadrupole Mass Spectrometer passes only those ions having a specific rate of mass to electric charges so as to obtain a mass spectrum. By the composition of the ions achieved from the above results, the composition of the sampled gas can be determined. The RGA-QMS used in the present invention is a portable system, and unlike general Open Ion Source (OIS) used in the sputtering process, the ion source is a Closed Ion Source (CIS) so that it is possible to analyze the process gas as well as bulk gas.

The sampling pressure is controlled uniformly below the process chamber pressure by the orifices (100/250 micron) inside the sampling manifold 50.

Figure 1:
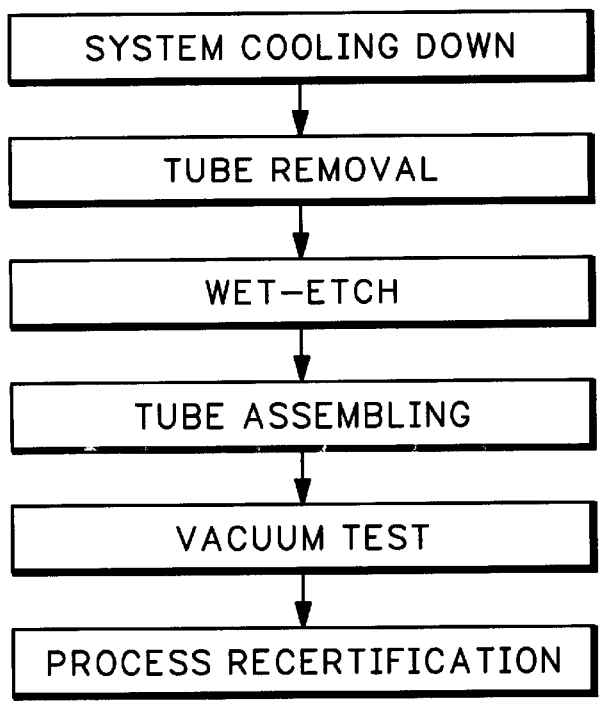
FIG. 1 is a brief representation showing the conventional sequence of a cleaning process for the process tube of the conventional Chemical Vapor Deposition (CVD) apparatus for manufacturing semiconductor devices.
Figure 3:
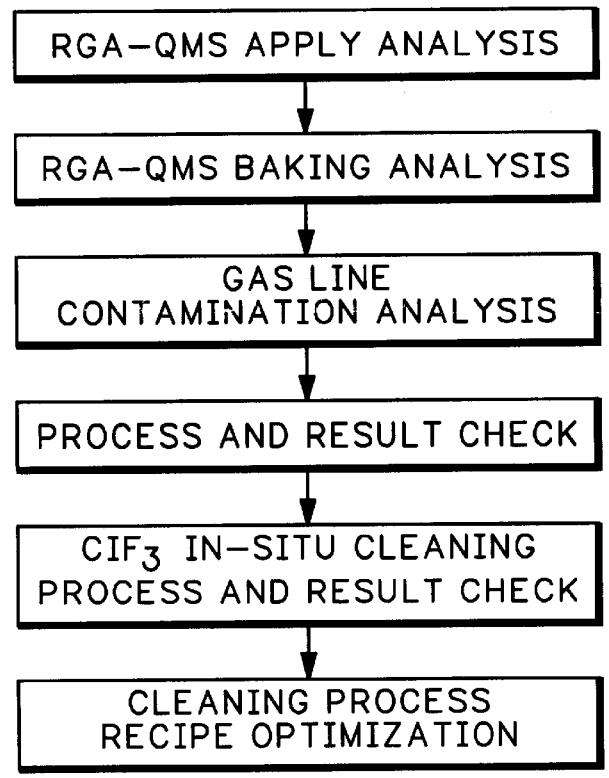
FIG. 3 shows a sequence for the process analysis and the cleaning process in the CVD apparatus of FIG. 2 according to one embodiment of the present invention.

Turning now to FIG. 3, a sequence for the process analysis and the cleaning process in the CVD apparatus of FIG. 2 will now be described. First, gas analyzer 80 is connected to the sampling manifold. $N_2$ gas is continuously supplied to purge the RGA-QMS. First air valve 62 and third air valve 60 are closed; second air valve 66 and fourth air valve 64 are opened. Then, fourth air valve 64 is closed, and first air valve 62 is open, and the gas inside the process chamber 10 is sampled. At this stage, if it is necessary to control the pressure both in the process chamber 10 and the sampling line 54, it can be done by operating a sampling pump 90 based on the pressure indicated on a CM gauge 76.

Then, the RGA-QMS baking evaluation is conducted. That is, after placing a quadrupole mass spectrometer inside an RGA-QMS chamber (not shown), baking is carried out in order to decrease the background. Since RGA-QMS is very sensitive to contamination, its contamination level is determined by analyzing the background spectrum as part of every test to measure contamination if any, by water and oxygen. When the contamination level is high, the RGA-QMS chamber is baked at about 250° C., and the sampling manifold is baked at about 150° C. so as to reduce the contamination level. During baking, the partial pressure of each molecular contaminant ($H_2O$, $H_2$, $O_2$, Ar, $CO_2$, etc.) is monitored. The outgasing of the contaminants is accelerated through the baking so that the background of the RGA-QMS is reduced.

Sequentially, the contamination for the gas line is analyzed, in order to analyze the integrity of each supply line ($SiH_4$, $PH_3$, and $N_2$). $N_2$ gas at 500 SCCM is introduced into each supply line, one by one. Gas inside the process chamber is then sampled and analyzed to determine if the gas supply line is leaking.

Figure 4:
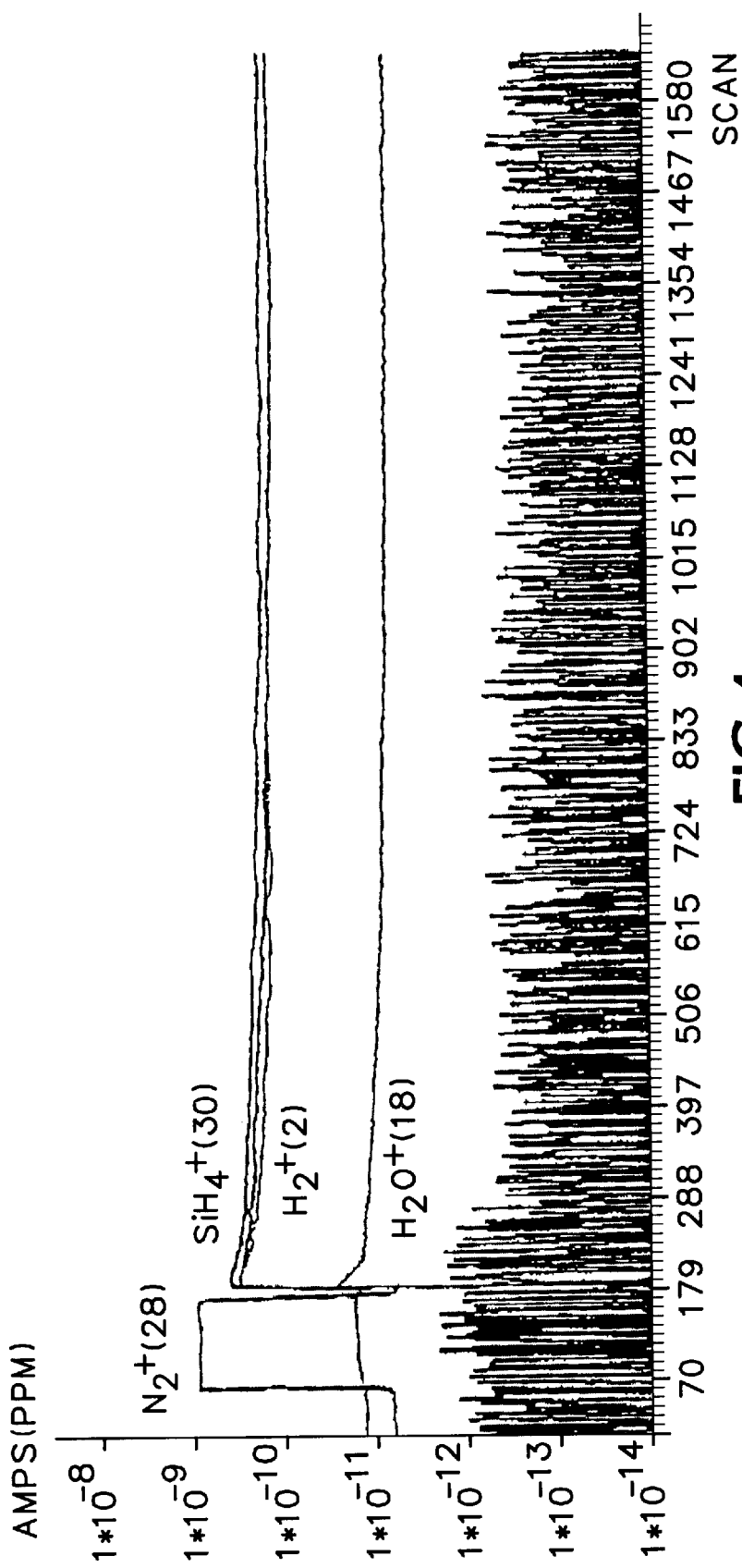
FIG. 4 shows an analysis trend for the storage polysilicon deposition process according to one embodiment of the present invention.

Then, a specific process for semiconductor wafers is carried out, and sampling is carried out so as to analyze the process. At this time, for example, in a storage-polysilicon deposition step of DRAM processing, continuous sampling may be carried out in the prepurge and after-purge step as well as in the deposition step. The manifold is maintained below the 0.9 Torr, pressure of the process chamber, by way of the critical orifice on the sampling manifold of the RGA-QMS. FIG. 4 shows a typical analysis trend for the storage-polysilicon formation process.

After the specific process for semiconductor wafers is completed, the boat containing the wafers is unloaded from a process chamber, and the waste-gas therein is discharged. Then, a $ClF_3$ in-situ cleaning process is carried out. In the case of depositing storage-poly layer to a thickness of 48,000 Å, the adhered layer inside the process chamber is etched away using a mixture of 2800 SCCM $N_2$ gas and 700 SCCM $ClF_3$ gas.

Figure 5:
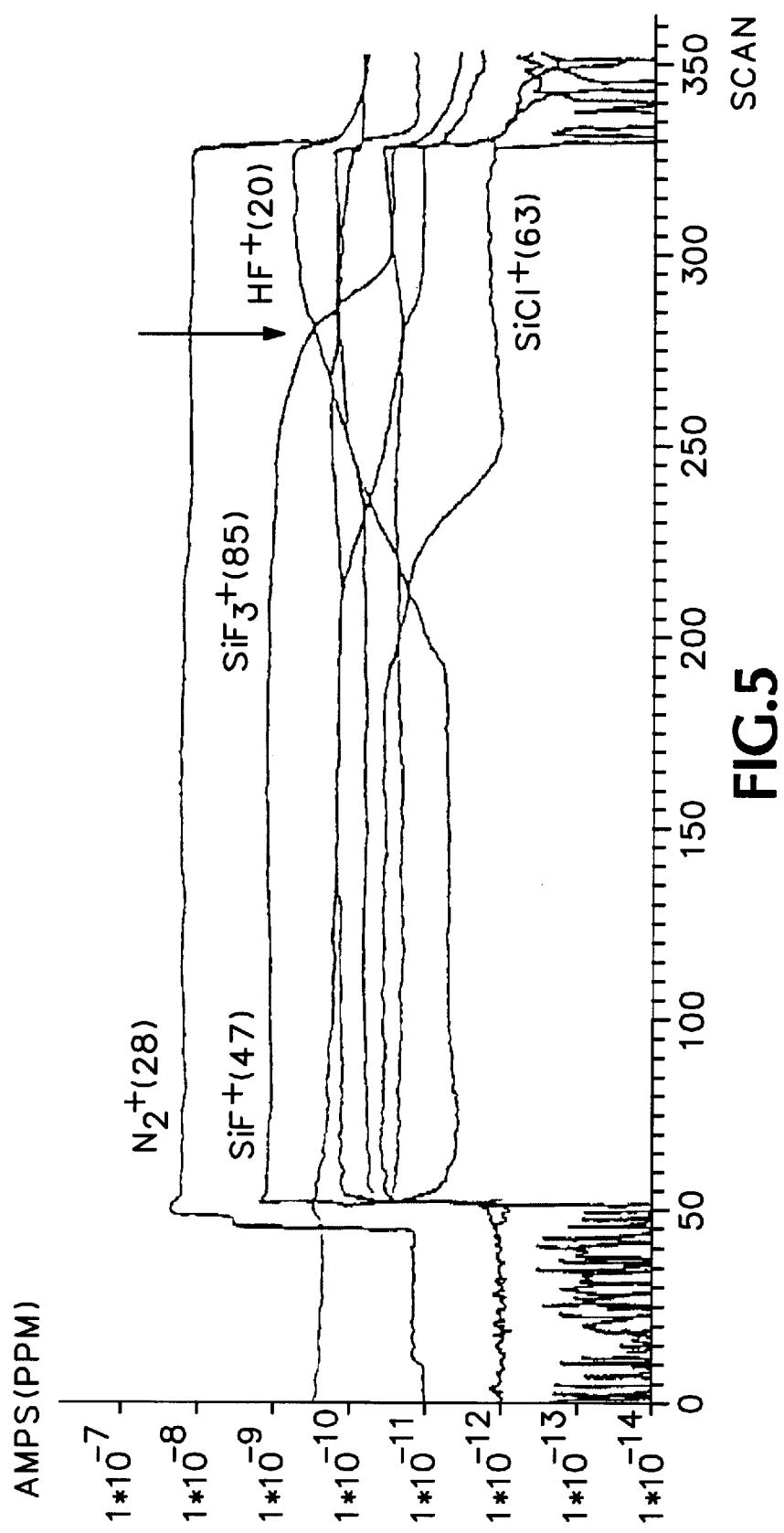
FIG. 5 shows an analysis trend for the cleaning process according to one embodiment of the present invention.

Then, cleaning process steps are analyzed to determine the End Point Detection (EPD) of cleaning process. The cleaning process is analyzed by alternately varying the pressure and temperature of the process chamber while maintaining the flow of cleaning gas (for example, $N_2$ gas of 2800 SCCM, and $ClF_3$ gas of 700 SCCM). Like the storage-poly formation process analysis, the EPD analysis of the cleaning process is performed throughout the whole cleaning process. FIG. 5 shows an analysis trend for the in-situ cleaning process by $ClF_3$ after storage-poly deposition process. As shown in FIG. 5, the cleaning process is divided into 3 steps. The first step is evacuating and purging the chamber prior to cleaning, as shown in FIG. 5, during the SCCM time from 0 to 50. The $ClF_3$ etching is carried out in the second step, and is represented in FIG. 5 from 50 to about 280 scan. The third step is the evacuation and purging after the etching is complete, which corresponds to the time after 280 scan.

Figure 6:
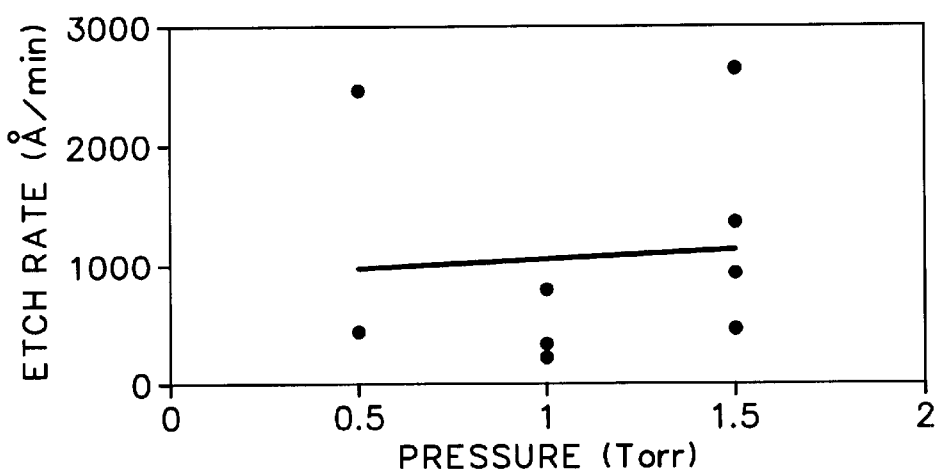
FIG. 6 is a graph correlating etch rate in the cleaning process to pressure inside a process chamber according to one embodiment of the present invention.
Figure 7:
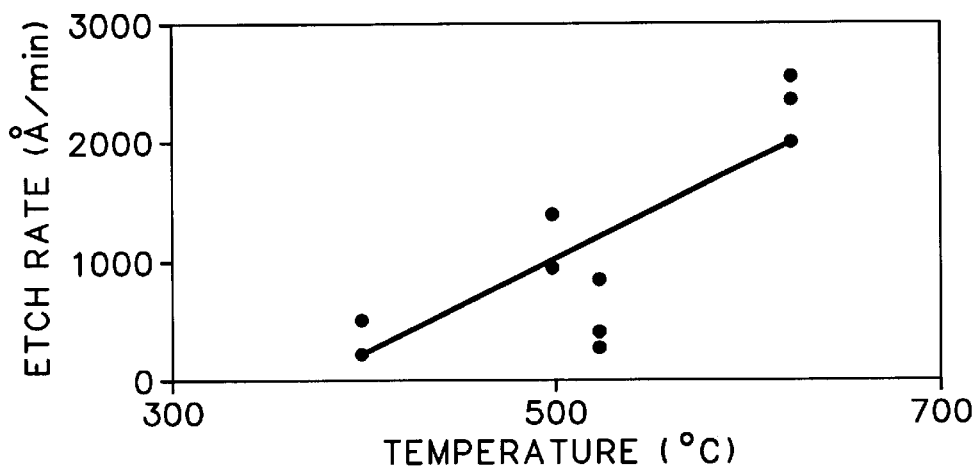
FIG. 7 is a graph correlating etch rate in the cleaning process to temperature inside a process chamber according to one embodiment of the present invention.
Figure 8:
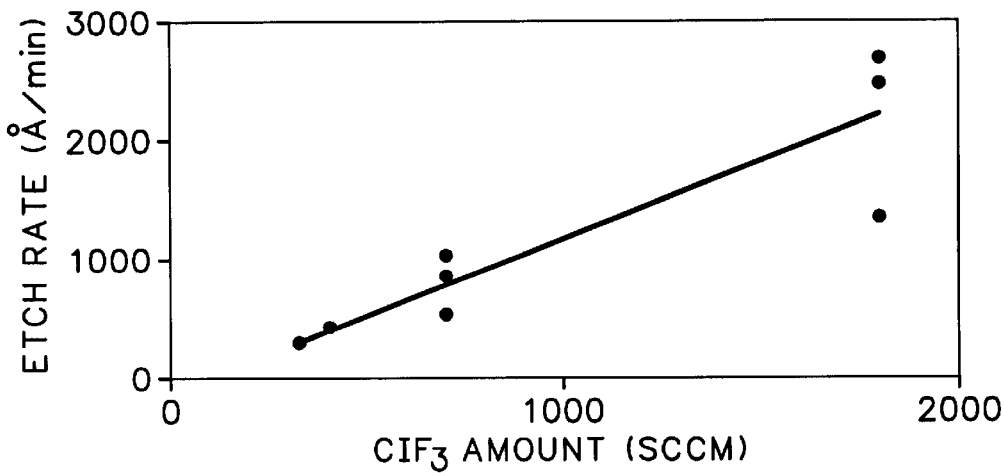
FIG. 8 is a graph correlating etch rate in the cleaning process to $ClF_3$ flow inside a process chamber according to one embodiment of the present invention.

As shown in FIG. 5, the EPD of the cleaning process is the point 100 around 280 scan. At about point 100 (scan=280), the concentration of HF+ equals the concentration of $SiF_3$+ in the process chamber. At that point, the $ClF_3$–$N_2$ gas mixture has largely etched away the silicon-containing layers on the inside walls of process chamber 10. After that point, continued flow of etchant gas into the process chamber results in unwanted etching of the polysilicon layer by the fluoride and chloride radicals generated by $ClF_3$. The unwanted etching of the polysilicon layer is indicated, according to the invention, by the detection of HF. HF is a polysilicon etching byproduct that is not present in relatively high concentrations during the etching of silicon from the process chamber walls. By repeatedly carrying out the same storage-poly deposition process by varying the pressure and temperature of process chamber 10, the flow rate of the $ClF_3$, and determining EPD for each case, the process time for each step of the cleaning process can be optimized. The results of the optimization as above are shown in FIGS. 6, 7 and 8. FIG. 6 is a graph correlating etch rate in the cleaning process to the pressure inside a process chamber 10. FIG. 7 is a graph correlating the etch rate during the cleaning process to the temperature inside process chamber 10. FIG. 8 is a graph correlating etch rate in the cleaning process to $ClF_3$ flow rate inside a process chamber. The effectiveness of the cleaning can be evaluated by monitoring the particles present in process chamber 10 before and after the cleaning process. Metal and ion contaminants such as Fe, Cr, Ni, Zn, Ti, S, Cl, F, $NH_4$ can also be monitored using with TXRF/HPIC (Total X-ray Reflection Fluorescence/High Performance Ion Chromatography) before and after the cleaning process.

Therefore, according to the present invention, without removing the process tubes, the process chamber can be in-situ cleaned so that the life of process chamber is increased, the cleaning time is shortened, and productivity is improved.

In addition, according to the present invention, the in-situ cleaning process can be optimized so that the life of the process chamber is increased and cleaning time is shortened. Further, according to the present invention, the processes for the wafers continuously is monitored, and analyzed so that the process malfuctioning is prevented contributing to the increase of the productivity. Still further, while the present invention has been described in detail, it should be understood that various changes, substitutions and alterations can be made hereto without departing from the spirit and scope of the invention as defined by the appended claims.

What is claimed is:

1. An apparatus for manufacturing semiconductor devices, comprising:
   a semiconductor process chamber;
   a plurality of process gas supply lines connected to the process chamber;
   a waste-gas exhaust line connected to the process chamber and a pump;
   a cleaning-gas supply line connected to the process chamber;
   a sampling manifold connected to the process chamber, wherein the sampling manifold includes:
      a first portion at a first pressure which is substantially equal to a pressure within the process chamber;
      a second portion at a second, lower pressure; and
      a member defining an orifice separating the first and second sampling manifold portions; and
   a gas analyzer connected to the sampling manifold,
   wherein said cleaning-gas supply line supplies cleaning gas to the process chamber and said gas analyzer determines when to stop supplying the cleaning gas thereto.

2. The apparatus of claim 1, wherein the sampling manifold includes a first air valve, a second air valve, a first isolation valve, a second isolation valve, a third isolation valve, and a gate valve.

3. The apparatus of claim 2, wherein the sampling manifold includes a purge-gas supply line.

4. The apparatus of claim 2, wherein the purge-gas supply line of the sampling manifold is connected to the first air valve and the second air valve, and wherein third and fourth air valves are further provided between the first and second air valves.

5. The apparatus of claim 2, wherein a Capacitance Manometer (CM) gauge and a sampling pump are installed between the first isolation valve and the second isolation valve of the sampling manifold.

6. The apparatus of claim 5, wherein a scrubber is further installed for cleaning the waste-gas passing through the pumping means of the waste-gas exhaust line, and the gas passing through the sampling pump is exhausted through the scrubber.

7. The apparatus of claim 2, wherein orifices of the first isolation valve, the second isolation valve, and the third isolation valve of the sampling manifold are 100 micron, 100 micron, and 250 micron respectively.

8. The apparatus of claim 1, wherein the gas analyzer is an RGA-QMS (Residual Gas Analyzer-Quadrupole Mass Spectrometer) comprising a mass-analyzer, a turbo-pump, and a baking pump.

9. The apparatus of claim 8, whether comprising a scrubber for cleaning waste-gas and connected to waste-gas exhaust line and the gas analyzer.

10. The apparatus of claim 1, wherein said gas analyzer determines when to stop supplying the cleaning gas by comparing the concentration of $HF^+$ and $SiF_3^+$ ions.

* * * * *

UNITED STATES PATENT AND TRADEMARK OFFICE
CERTIFICATE OF CORRECTION

PATENT NO.  : 6,279,503 B1  Page 1 of 1
DATED       : August 28, 2001
INVENTOR(S) : Choi et al.

It is certified that error appears in the above-identified patent and that said Letters Patent is hereby corrected as shown below:

Column 2,
Line 23, "$CIF_3$" should read -- $ClF_3$ --;

Column 3,
Lines 35 and 44, "$CIF_3$" should read -- $ClF_3$ --;

Column 4,
Lines 10 and 35, "$CIF_3$" should read -- $ClF_3$ --;

Column 5,
Line 14, "20+5" should read -- 20±5 --;
Line 20, "$CIF_3$" should read -- $ClF_3$ --;

Column 8,
Line 37, "whether" should read -- further --.

Signed and Sealed this

Seventeenth Day of December, 2002

JAMES E. ROGAN
*Director of the United States Patent and Trademark Office*